(12) United States Patent
Bedell et al.

(10) Patent No.: US 7,968,459 B2
(45) Date of Patent: Jun. 28, 2011

(54) ION IMPLANTATION COMBINED WITH IN SITU OR EX SITU HEAT TREATMENT FOR IMPROVED FIELD EFFECT TRANSISTORS

(75) Inventors: Stephen W. Bedell, Wappingers Falls, NY (US); Joel P. DeSouza, Putnam Valley, NY (US); Zhibin Ren, Hopewell Function, NY (US); Alexander Reznicek, Mount Kisco, NY (US); Devandra K. Sadana, Pleasantville, NY (US); Katherine L. Saenger, Ossining, NY (US); Ghavam Shahidi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 261 days.

(21) Appl. No.: 12/128,040

(22) Filed: May 28, 2008

(65) Prior Publication Data
US 2008/0258220 A1 Oct. 23, 2008

Related U.S. Application Data

(63) Continuation of application No. 11/417,846, filed on May 4, 2006, now abandoned.

(51) Int. Cl.
*H01L 21/44* (2006.01)
(52) U.S. Cl. ........ 438/660; 438/909; 438/943; 257/350; 257/E21.321; 257/E21.336
(58) Field of Classification Search .................. 438/660, 438/909, 943
See application file for complete search history.

(56) References Cited

U.S. PATENT DOCUMENTS

| | | | |
|---|---|---|---|
| 6,096,607 | A | 8/2000 | Ueno |
| 6,235,568 | B1 | 5/2001 | Murthy et al. |
| 6,573,030 | B1 * | 6/2003 | Fairbairn et al. .............. 430/323 |
| 6,621,131 | B2 | 9/2003 | Murthy et al. |
| 2004/0197970 | A1 | 10/2004 | Komatsu |
| 2005/0082616 | A1 | 4/2005 | Chen et al. |
| 2005/0124123 | A1 | 6/2005 | Itani et al. |
| 2006/0054891 | A1 | 3/2006 | Chu et al. |

OTHER PUBLICATIONS

Morehead, F.F. et al., "Formation of Amorphous Silicon by Ion Bombardment as a Function of Ion, Temperature, and Dose," J. Appl. Phys. 43 1112, 1972.

* cited by examiner

*Primary Examiner* — Matthew C Landau
*Assistant Examiner* — Sonya D McCall Shepard
(74) *Attorney, Agent, or Firm* — Scully, Scott, Murphy & Presser, P.C.; Louis J. Percello, Esq.

(57) ABSTRACT

This invention teaches methods of combining ion implantation steps with in situ or ex situ heat treatments to avoid and/or minimize implant-induced amorphization (a potential problem for source/drain (S/D) regions in FETs in ultrathin silicon on insulator layers) and implant-induced plastic relaxation of strained S/D regions (a potential problem for strained channel FETs in which the channel strain is provided by embedded S/D regions lattice mismatched with an underlying substrate layer). In a first embodiment, ion implantation is combined with in situ heat treatment by performing the ion implantation at elevated temperature. In a second embodiment, ion implantation is combined with ex situ heat treatments in a "divided-dose-anneal-in-between" (DDAB) scheme that avoids the need for tooling capable of performing hot implants.

21 Claims, 9 Drawing Sheets

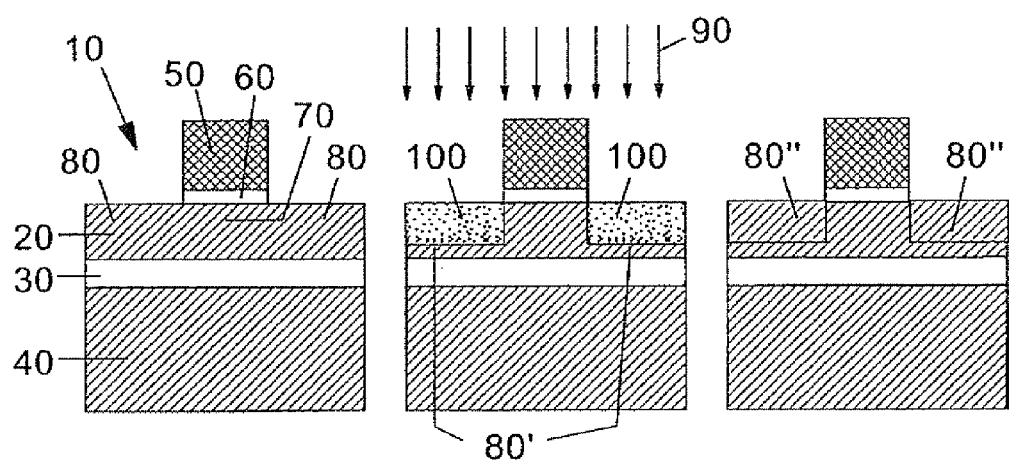
FIG. 1A PRIOR ART
FIG. 1B PRIOR ART
FIG. 1C PRIOR ART
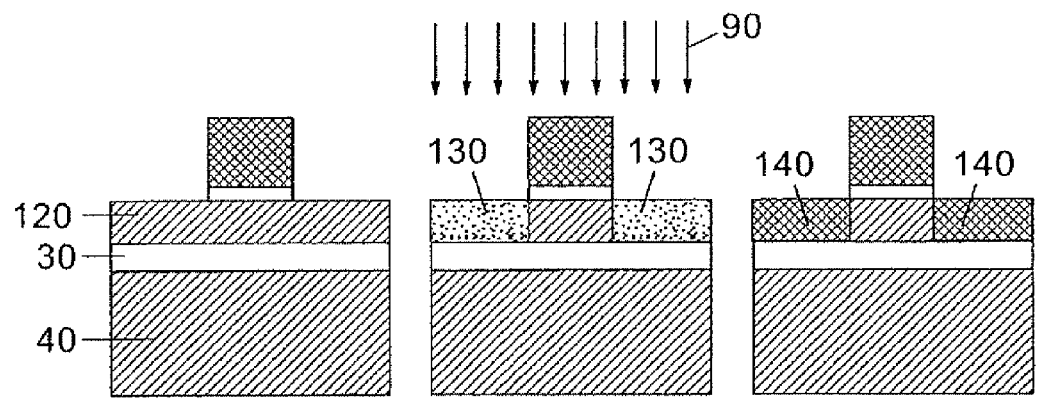
FIG. 1D PRIOR ART
FIG. 1E PRIOR ART
FIG. 1F PRIOR ART

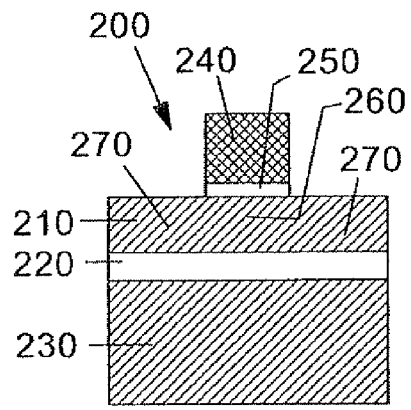
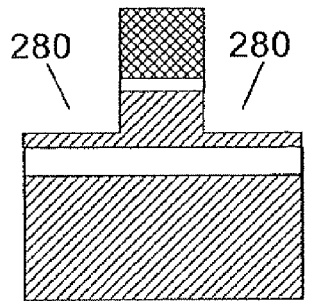
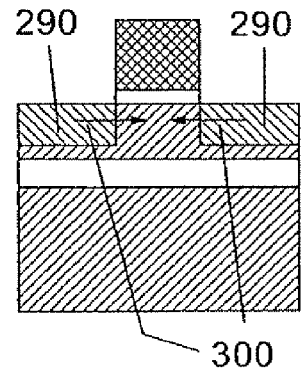
FIG. 2A
PRIOR ART
FIG. 2B
PRIOR ART
FIG. 2C
PRIOR ART
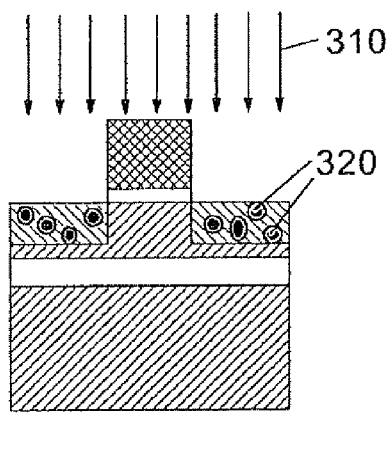
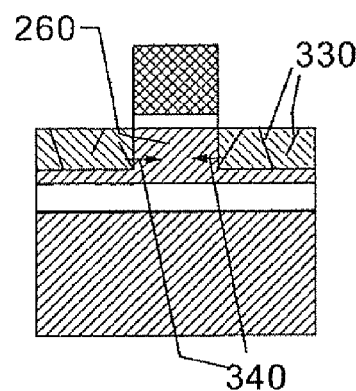
FIG. 2D
PRIOR ART
FIG. 2E
PRIOR ART

ION IMPLANTATION COMBINED WITH IN SITU OR EX SITU HEAT TREATMENT FOR IMPROVED FIELD EFFECT TRANSISTORS

RELATED APPLICATIONS

This application is a continuation of U.S. patent application Ser. No. 11/417,846, filed May 4, 2006.

FIELD OF THE INVENTION

This invention generally relates to complementary metal oxide semiconductor (CMOS) circuits comprising field effect transistors (FETs) fabricated with one or more ion implantation steps. More particularly, it relates to the ways in which these ion implantation steps may be combined with in situ or ex situ heat treatments to avoid and/or minimize implant-induced amorphization (a potential problem for source/drain regions in FETs in ultrathin silicon on insulator layers) and implant-induced plastic relaxation of strained source/drain regions (a potential problem for strained channel FETs in which the channel strain is provided by embedded source/drain regions lattice mismatched with an underlying substrate layer).

BACKGROUND OF THE INVENTION

Historically, most performance improvements in semiconductor field-effect transistors (FET) have been achieved by scaling down the relative dimensions of the device. This trend is becoming increasingly more difficult to maintain as the devices reach their physical scaling limits. As a consequence, advanced FETs and the complementary metal oxide semiconductor (CMOS) circuits in which they can be found are increasingly relying on strain engineering and specialty silicon-on-insulator substrates to achieve desired circuit performance. However, the ion implantation steps used in fabricating the FETs relying on these enhancements present two particular challenges.

The first challenge pertains to source/drain (S/D) implants in CMOS fabricated in ultrathin silicon-on-insulator (UT-SOI) substrates, where the UTSOI layer is typically in the range from 6 to 30 nm in thickness. It is difficult to implant the desired concentration of certain dopant species in the S/D regions without amorphizing the entire SOI layer. If there is no crystalline Si left under the amorphized S/D regions to act as a seed or template, the S/D recrystallization will be highly defective (and thus unsuitable for high performance devices). Through-SOI-thickness amorphization is of particular concern with heavy ions such as $As^+$ and with UTSOI layers on the thin end of the thickness range. This problem is illustrated in FIG. 1 in which the basic steps of a S/D implant and annealing process for an UTSOI FET having a desired outcome are shown in FIGS. 1A-1C and the basic steps of a S/D implant and annealing process having an undesired outcome are shown in FIGS. 1D-1F.

FIG. 1A shows UTSOI FET 10 at an early stage of processing. UTSOI FET 10 comprises single crystal UTSOI layer 20 disposed on buried oxide (box) layer 30 on base substrate 40, with conductive gate 50 disposed on gate dielectric 60 over UTSOI channel region 70 separating UTSOI S/D regions 80. FIG. 1B shows the structure of FIG. 1A after S/D regions 80 have been amorphized with ion implant 90 to create amorphized S/D regions 100. Residual crystalline regions 80' remain under amorphized S/D regions, providing a template for the amorphized S/D regions to recrystallize by solid phase epitaxy (SPE) during subsequent activation annealing to produce single-crystal S/D regions 80", as shown in FIG. 1C.

FIGS. 1D-1F show what happens when the same implant 90 is applied to the slightly thinner UTSOI layer 120 of FIG. 1D. In this case, ion implant 90 produces amorphized S/D regions 130 extending all the way to box layer 30, as shown in FIG. 1E. Due to the lack of a single crystal Si template, recrystallization of these amorphized S/D regions during subsequent activation annealing thus produces polycrystalline S/D regions 140, as shown in FIG. 1F. This is undesirable because doped polycrystalline Si has a much higher resistance than crystalline Si having the same dopant density.

The second challenge pertains to FETs relying on strain engineering. In these FETs, the channel regions of the transistors are strained to produce an increase in the mobility of the charge carriers and thus an increase in the on-state current of the device (at a given drain potential).

One method that is currently used to induce channel strain is to grow a compressively strained SiGe layer in a recessed region adjacent to the channel region of the device, as described in U.S. Pat. No. 6,621,131, "Semiconductor Transistor Having a Stressed Channel," issued Sep. 16, 2003. The SiGe layer then serves as the S/D of the device and imparts uniaxial strain on the channel. The amount of strain in the channel will be proportional to the stress applied by the SiGe layer, which would typically increase with the Ge content of the SiGe. Since increased strain in the channel correlates with better device performance, there is a great interest in SiGe stressors having a high Ge content.

One of the primary challenges in using single-crystal strained regions as a stressor for the channel is to prevent the formation of strain relieving dislocations during strained region growth and subsequent processing. It has been found that the ion implantation step that is used to dope and electrically activate the S/D regions facilitates the relaxation of the strain in the SiGe S/D regions, as illustrated in FIGS. 2A-2F, which show, in cross section view, the steps in fabricating a FET with channel strain induced by embedded SiGe S/D regions whose processing requires at least one ion implantation step.

FIG. 2A shows SOI FET 200 at an early stage of processing. SOI FET 200 comprises single crystal SOI layer 210 disposed on buried oxide (box) layer 220 on base substrate 230, with conductive gate 240 disposed on gate dielectric 250 over SOI channel region 260 separating SOI S/D regions 270. FIG. 2B shows the structure of FIG. 2A after S/D regions 270 have been etched away to form cavities 280. Cavities 280 are then replaced by epitaxially grown SiGe stressor S/D regions 290 which exert a force on the channel region, as indicated by arrows 300 in FIG. 2C. Implantation of SiGe regions 290 by non-amorphizing implant 310 produces multiple defects 320 as shown in FIG. 2D. These defects act as nucleation sites for strain-relieving dislocations 330 that form during subsequent activation annealing, as shown in FIG. 2E, where short arrows 340 indicate the reduced force of the S/D regions on channel region 260 as compared to longer arrows 300 in FIG. 2C.

Certain implantation conditions (particularly those involving heavy ions such as $As^+$) can result in a significant and irreversible reduction in strain after a prescribed thermal treatment step called an "activation anneal." Since the driving force for strain relaxation increases with strain, SiGe alloys with a high Ge content are particularly susceptible to undesired relaxation. A method for S/D ion implantation and activation that minimizes S/D plastic relaxation and preserves as much strain as possible would be highly desirable.

The efficacy of heated implants in reducing ion implant damage in bulk semiconductors has been known for some time. The threshold dose of implanted ions required to amorphize a given semiconductor region in a substrate increases with substrate temperature because the transition from a crystalline material to an amorphous one is determined by the competition between the temperature-independent rate at which the damage and disorder are generated by the implanted ions and the temperature-dependent rate at which the implant damage can be spontaneously repaired. For example, the threshold dose required for amorphization with 200 keV B implanted at low current densities into 100-oriented single crystal Si increases by a factor of 40 as the Si substrate temperature is increased from 200 K to 300 K as described by F. F. Morehead et al., J. Appl. Phys. 43 1112 (1972). While these and similar effects are well known for bulk Si and the III-Vs, the benefits of hot implants have not been previously applied to solve the new problems addressed by the present invention, namely, reduction and/or elimination of (i) implant-induced source/drain amorphization in UTSOI CMOS, and (ii) implant-induced plastic relaxation in FETs with strained source/drain regions.

It is therefore an object of this invention to provide an ion implantation method that allows the desired dopant density profiles to be achieved with satisfactorily limited amorphized layer thicknesses and/or satisfactorily low levels of strain relaxation.

It is a further object of this invention to provide an alternative to the ion implantation method above, wherein said alternative also produces satisfactorily limited amorphized layer thicknesses and/or satisfactorily low levels of strain relief, that is easier to implement with existing tooling.

SUMMARY OF THE INVENTION

The present invention teaches the use of ion implantation in combination with in situ or ex situ heat treatments as a method for avoiding or reducing ion implant-induced amorphization and ion implant-induced plastic relaxation.

In a first embodiment of the invention, ion implantation is combined with in situ heat treatment, i.e., implants having the potential to produce undesired amorphization or strain relief are performed at elevated temperature with respect to room temperature. In particular, the invention describes:

the fabrication of an FET device in a bulk semiconductor or semiconductor-on-insulator layer in which at least some ion implantation of said FET's source/drain regions is performed while the semiconductor layer is held at an elevated temperature;

the fabrication of an FET device in a bulk semiconductor or semiconductor-on-insulator layer in which at least some features in addition to the FET's source/drain regions are implanted while the semiconductor layer is held at an elevated temperature; and the fabrication of an FET device in a bulk semiconductor or semiconductor-on-insulator layer, the FET device comprising strained source/drain regions, in which at least some implantation of the strained source/drain regions is performed while the semiconductor layer is held at an elevated temperature.

The elevated temperatures for the in situ heat treatments of this invention would typically be in the range from 70 to 900° C., preferably be in the range from 150 to 550° C., and most preferably be in the range from 200 to 350° C. Ion implantation at elevated temperatures may also be conveniently described as "hot implantation," "hot implants," "heated implantation," or "heated implants."

In a second embodiment of the invention, ion implantation is combined with ex situ heat treatments in a "divided-dose-anneal-in-between" (DDAB) scheme that avoids the need for tooling capable of performing hot implants. In this embodiment, the desired total dose is divided into smaller sub-doses, each of which is below the threshold for amorphizing the entire thickness of the S/D regions (for the case of UTSOI) or generating significant strain relief (for the case of strained S/D regions). Annealing performed after each implant recrystallizes the amorphized regions by solid phase epitaxy and/or reduces damage accumulation to a negligible level.

Another aspect of the invention provides FETs and CMOS circuits fabricated with heated implants and/or the DDAB method of implantation.

BRIEF DESCRIPTION OF THE DRAWINGS

These and other features, objects, and advantages of the present invention will become apparent upon a consideration of the following detailed description of the invention when read in conjunction with the drawings, in which:

FIGS. 1A-1F show, in cross section view, the basic steps of a S/D implant and annealing process for a UTSOI FET having a desired outcome (FIGS. 1A-1C) and the basic steps of a S/D implant and annealing process having an undesired outcome (FIGS. 1D-1F);

FIGS. 2A-2E show, in cross section view, the steps in fabricating a FET with channel strain induced by embedded SiGe S/D regions whose processing requires at least one ion implantation step;

DESCRIPTION OF THE PREFERRED EMBODIMENTS

Figure 3A:
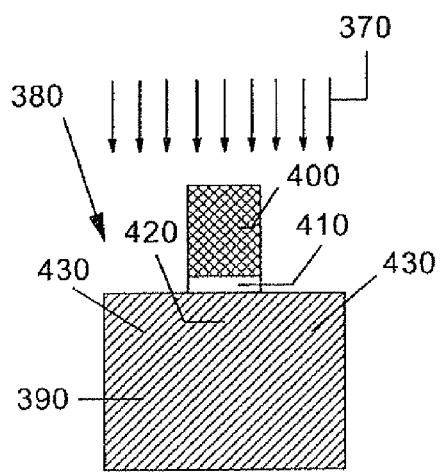
FIGS. 3A-3E show, in cross section view, some structures which may be heated during ion implantation according to the method this invention.
Figure 3B:
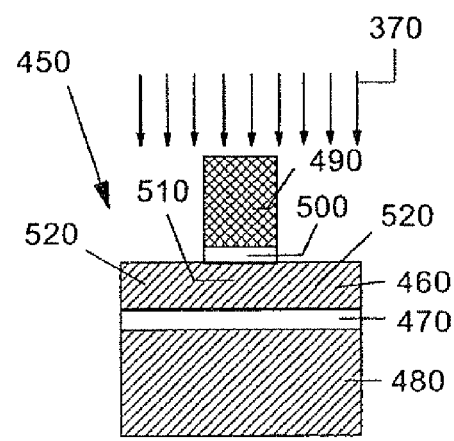

Referring now to the drawings, FIGS. 3A-3E show, in cross section view, some structures which may be heated during ion implantation according to the method of this invention. FIG. 3A shows ion implant 370 being applied to partially completed FET 380 in bulk semiconductor 390, where partially completed FET 380 comprises conductive gate 400 on gate dielectric 410 over channel region 420 separating S/D regions 430. FIG. 3B shows ion implant 370 being applied to partially completed FET 450 in semiconductor-on-insulator layer 460 on box layer 470 on base substrate 480, where partially completed FET 450 comprises conductive gate 490 on gate dielectric 500 over channel region 510 separating S/D regions 520. The conditions of ion implant 370 would typically be selected so that at least some of S/D regions 430 and 520 would be implanted while gates 400 and 490 would protect channel regions 420 and 510 from being implanted.

Figure 3C:
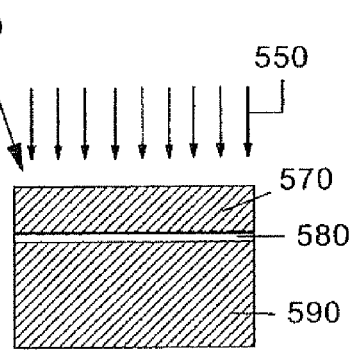

FIG. 3C shows ion implant 550 being applied to semiconductor-on-insulator substrate 560 comprising semiconductor-on-insulator layer 570 on box layer 580 on base substrate 590. In this case, the conditions of ion implant 550 might be selected to provide a peak concentration of implanted species in base substrate 590 under box layer 580 rather than in semiconductor-on-insulator layer 570 on top of box layer 580. Such implant conditions may be useful for fabricating certain back-gated devices in which the semiconductor directly under the box functions as a back gate. FIG. 3C thus provides an example of how heated implants in the range from 70° C. to 900° C. may be used in fabricating FET devices in a bulk semiconductor or semiconductor-on-insulator layer so that at least some features in addition to the FET's source/drain regions are implanted, since with heated implants it becomes possible to implant a high concentration of dopants into base substrate 590 without running the risk of amorphizing semiconductor-on-insulator 570.

Figure 3D:
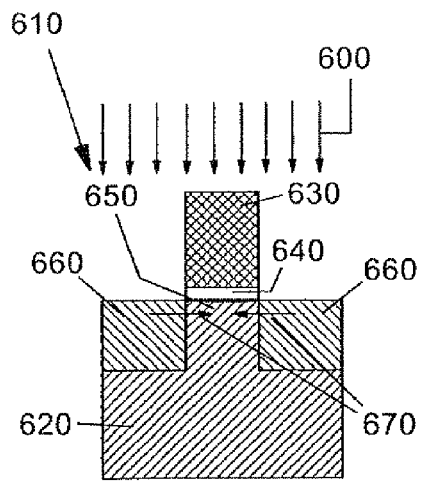
Figure 3E:
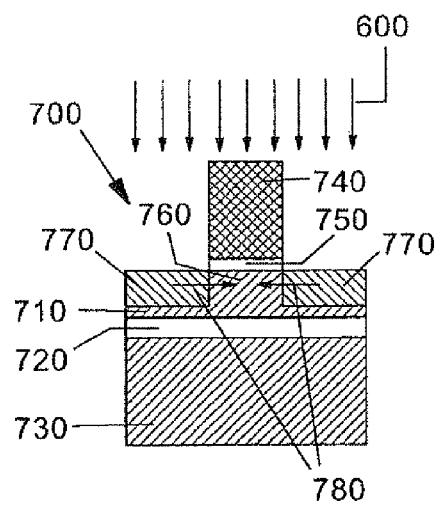
Figure 4A:
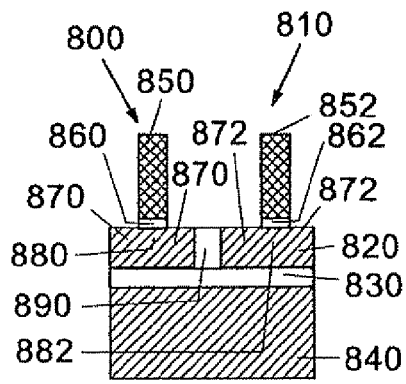
FIGS. 4A-4G show, in cross section view, the steps of a DDAB method applied to the fabrication of a UTSOI FET in a CMOS circuit.
Figure 4B:
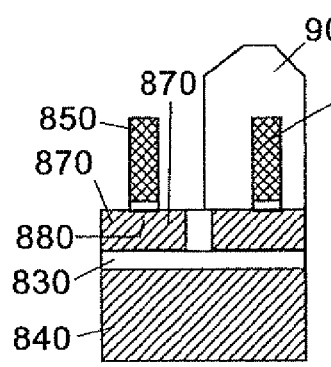
Figures 4C, 4D:
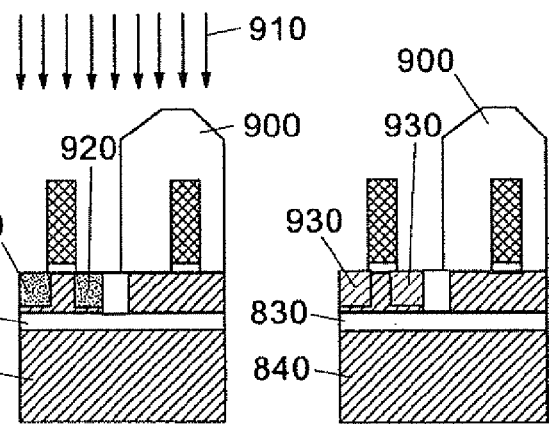
Figure 4E:
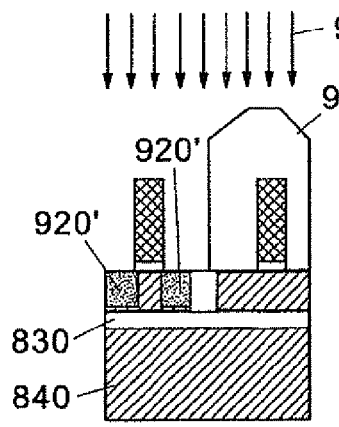
Figure 4F:
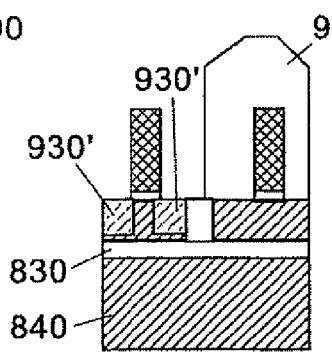
Figure 4G:
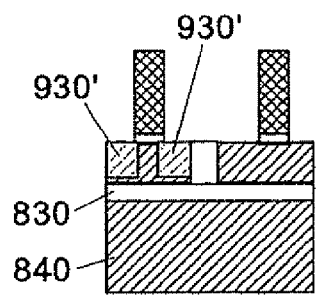
Figure 5A:
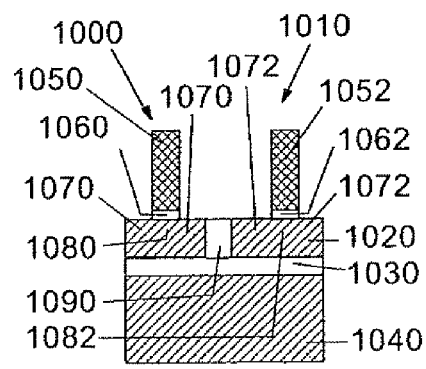
FIGS. 5A-5H show, in cross section view, the steps of a DDAB method applied to the fabrication of a strain-engineered FET in a CMOS circuit, where the strain-engineered FET has channel strain induced by embedded S/D regions.
Figure 5B:
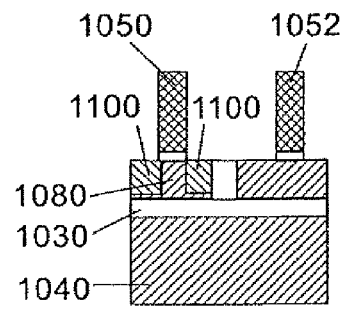
Figure 5C:
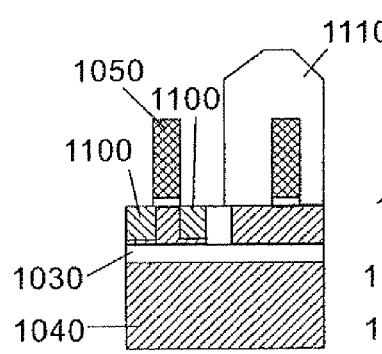
Figure 5D:
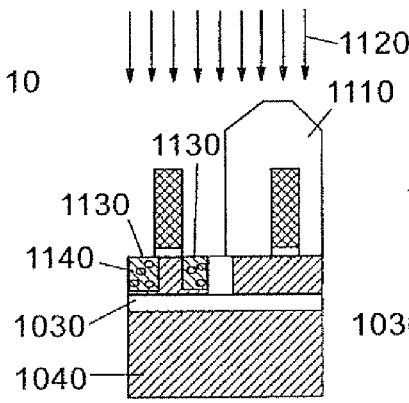
Figure 5E:
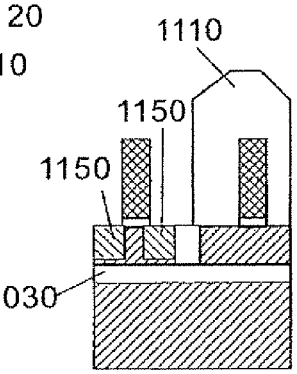
Figure 5F:
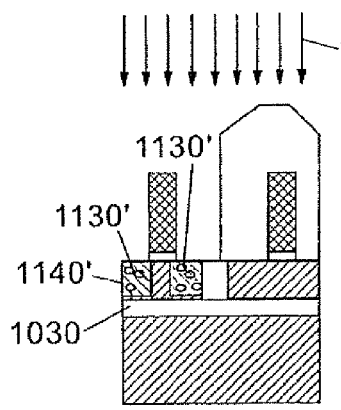
Figure 5G:
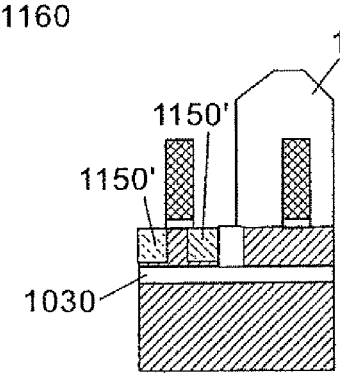
Figure 5H:
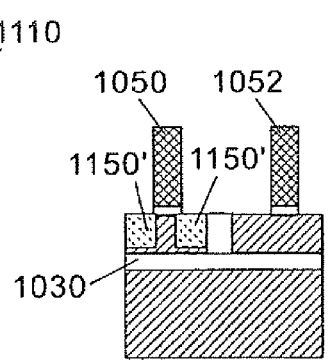

FIG. 3D shows ion implant 600 being applied to partially completed FET 610 in bulk semiconductor 620, where partially completed FET 610 comprises conductive gate 630 on gate dielectric 640 over channel region 650 separating semiconductor S/D regions 660. Semiconductor S/D regions 660 are strained and formed from a different material than channel region 650. The conditions of ion implant 600 might be selected to provide a light doping of S/D regions 660, but no amorphization. For example, channel region 650 might comprise Si and S/D regions 660 might comprise strained SiGe. The force of S/D regions 660 on channel region 650 is indicated by arrows 670. FIG. 3E shows the semiconductor-on-insulator analog of FIG. 3D. Ion implant 600 is now being applied to partially completed FET 700 in semiconductor-on-insulator layer 710 on box layer 720 on base substrate 730, where partially completed FET 700 comprises conductive gate 740 on gate dielectric 750 over semiconductor-on-insulator channel region 760 separating strained semiconductor S/D regions 770, where arrows 780 indicate the stress exerted on channel region 760 by S/D regions 770.

Patterned masking layers may be used in these hot implant processes. Ideally, patterned masking layers not remaining in the final device (i.e., disposable masking layers) would be formed prior to the hot implantation step and removed after the hot implantation step. These patterned masking layers would typically define first source/drain (or other) regions that would be subjected to the hot implantation and second source/drain (or other) regions that would be protected from the hot implantation. These disposable masking layers are preferably easily patterned, thermally stable, and easy to remove without damaging the underlying substrate. An example of a mask material meeting these requirements is amorphous carbon with a hydrogen content less than about 15 atomic %. This material is thermally stable and may be patterned (as well as removed) by oxygen-based plasma etching without damage to underlying oxide, nitride, and/or silicon substrate layers. While oxide and nitride layers are also thermally stable and perhaps more easily patterned than amorphous carbon, such materials are harder to remove selectively with respect to the substrate. Multilayer masks comprising one or more upper oxide and/or nitride layers on a base layer of amorphous carbon may provide the optimum compromise between ease of patterning and selective removal.

In a second embodiment of the invention, ion implantation is combined with ex situ heat treatments in a "divided-dose-anneal-in-between" (DDAB) scheme. In this embodiment, the desired total dose is divided into smaller sub-doses, each of which is below the threshold for amorphizing the entire thickness of the S/D regions (for the case of UTSOI) or generating significant strain relief (for the case of strained S/D regions). Annealing performed after each implant restores the S/D regions to their pre-implant levels of crystallinity and/or strain before the accumulated damage reaches a level that is irreversible. Depending on the implantation conditions (species, energy, dose, ion angle of incidence, substrate temperature, etc.), some to none of the thickness of the implanted S/D regions may be amorphized. For high-dose implants producing an amorphous layer, the between-implant anneals restore the initial crystallinity by solid phase epitaxy; for low-dose, non-amorphizing implants, the between-implant anneals remove the incipient nucleation sites for strain-relieving dislocations before they fully develop.

The basic DDAB method of ion implantation comprises
selecting a substrate including a semiconductor layer;
defining first semiconductor layer regions that will be subjected to at least two subsequent ion implantation steps and second semiconductor layer regions that will be protected from said at least two subsequent ion implantation steps;
subjecting the first semiconductor layer regions (but not the second semiconductor layer regions) to a first ion implantation;
subjecting the substrate to a first anneal;
subjecting the first semiconductor layer regions (but not the second semiconductor layer regions) to a final ion implantation; and
subjecting the substrate to a final anneal;
wherein residual damage left in the first semiconductor layer regions (as measured by strain loss and/or defect density) after the final anneal is less than the residual damage that would be left in the first semiconductor layer regions if the above process steps were performed without the first anneal.

The DDAB method would typically further include
applying a masking layer defining the first and second semiconductor layer regions in the substrate before each implant step and removing the masking layer from the substrate before each annealing step; or
applying a masking layer defining the first and second semiconductor layer regions in the substrate before the first implant step and not removing the masking layer from the substrate until after the final implant step.

The DDAB method may contain any number of implant and anneal steps to achieve the desired dopant dose and profile with sufficiently low damage to the semiconductor layer regions being implanted. For more than two implant steps, the basic DDAB method above would further include one or more cycles of supplemental implant and annealing steps comprising
subjecting the first semiconductor layer regions (but not the second semiconductor layer regions) to a supplemental ion implantation; and
subjecting the substrate to a supplemental anneal; the cycles performed after the first anneal and before the final implant, wherein residual damage left in the first semiconductor layer regions (as measured by strain loss and/or defect density) after the final anneal is less than the residual damage that would be left in the first semiconductor layer regions if the above process steps were performed without the first and the supplemental annealing steps.

The DDAB method of ion implantation may also be implemented without regard to the final levels of semiconductor layer damage, in accord with the previously described steps of selecting a substrate including a semiconductor layer;

defining first semiconductor layer regions that will be subjected to at least two subsequent ion implantation steps and second semiconductor layer regions that will be protected from said at least two subsequent ion implantation steps;

a subjecting the first semiconductor layer regions (but not the second semiconductor layer regions) to a first ion implantation; subjecting the substrate to a first anneal;

subjecting the first semiconductor layer regions (but not the second semiconductor layer regions) to a final ion implantation; and subjecting the substrate to a final anneal; in combination with the step of applying a masking layer defining the first and second semiconductor layer regions in the substrate before the first implant step, the masking layer remaining in place until after the final implant step.

This version of the DDAB method may also include one or more cycles of supplemental implant and annealing steps comprising subjecting the first semiconductor layer regions (but not the second semiconductor layer regions) to a supplemental ion implantation; and subjecting the substrate to a supplemental anneal; the cycles performed after the first anneal and before the final implant.

Suitable materials for masks used with DDAB are similar to those described above for hot implants. In addition, between-implant anneal temperatures of 230° C. and below are expected to be compatible with many patterned photoresist layers. If higher temperatures are needed (as expected), one may strip the resist before each annealing step and reapply it before each implant step.

FIG. 4 shows the steps of a DDAB method applied to the fabrication of a UTSOI FET in a CMOS circuit. FIG. 4A shows partially completed FETs 800 and 810 in UTSOI layer 820 disposed on box layer 830 disposed on base substrate 840. One of partially completed FETs 800 and 810 might be an n-channel FET (nFET) and the other of FETs 800 and 810 might be a p-channel FET (pFET). FETs 800 and 810 comprise gates 850 and 852 and gate dielectrics 860 and 862 disposed on channel regions 880 and 882 separating S/D regions 870 and 872. FETs 800 and 810 are separated by shallow trench isolation regions 890. FIG. 4B shows the structure of FIG. 4A after application of patterned masking layer 900 to protect FET 810 from one or more subsequent ion implants. FIG. 4C shows the structure of FIG. 4B being subjected to a first ion implant 910 which amorphizes an upper portion of S/D regions 870 of FET 800 to form amorphized S/D regions 920 which do not extend all the way down to box layer 830. The structure of FIG. 4C is then annealed, allowing amorphized S/D regions 920 to recrystallize by solid phase epitaxy to form recrystallized S/D regions 930, as shown in FIG. 4D. Patterned masking layer 900 may remain in place during the anneal, or be removed before the anneal and replaced after the anneal. FIG. 4E shows the structure of FIG. 4D being subjected to a final ion implant 940 which may be the same as or different from first ion implant 910. Typically ion implant 940 would be the same as or very similar to ion implant 910, with the sum of the doses of implants 910 and 940 equal to the total desired implant dose. Ion implant 940 again amorphizes an upper portion of S/D regions 870 of FET 800 to form amorphized S/D regions 920' which do not extend all the way down to box layer 830. The structure of FIG. 4E is then annealed, allowing amorphized S/D regions 920' to recrystallize by solid phase epitaxy to form recrystallized S/D regions 930'. Activation annealing may be included in the recrystallization anneal, or performed separately. Patterned masking layer 900 is removed before or after these last annealing steps to produce the structure of FIG. 4G.

FIG. 5 shows the steps of a DDAB method applied to the fabrication of a strain-engineered FET in a CMOS circuit, where the strain-engineered FET has channel strain induced by embedded S/D regions. FIG. 5A shows partially completed FETs 1000 and 1010 in semiconductor layer 1020 disposed on box layer 1030 disposed on base substrate 1040. One of partially completed FETs 1000 and 1010 might be an nFET and the other of FETs 1000 and 1010 might be a pFET. FETs 1000 and 1010 comprise gates 1050 and 1052 and gate dielectrics 1060 and 1062 disposed on channel regions 1080 and 1082 separating S/D regions 1070 and 1072. FETs 1000 and 1010 are separated by shallow trench isolation regions 1090. FIG. 5B shows the structure of FIG. 5A after S/D regions 1020 of FET 1000 have been replaced by embedded S/D regions 1100, according to prior art methods illustrated in FIGS. 2A-2C. Embedded S/D regions 1100 are strained and exert a stress on channel region 1080. FIG. 5C shows the structure of FIG. 5B after application of patterned masking layer 1110 to protect FET 1010 from one or more subsequent ion implants. FIG. 5D shows the structure of FIG. 5C being subjected to a non-amorphizing first ion implant 1120 to produce lightly damaged S/D regions 1130 including many small defects indicated by circles 1140. It is believed that defects 1140 represent damage regions that are too small or otherwise insufficient to nucleate stacking faults or other strain-relieving dislocations. The structure of FIG. 5D is then annealed to produce repaired S/D regions 1150, as shown in FIG. 5E. Patterned masking layer 1110 may remain in place during the anneal or be removed before the anneal and replaced after the anneal. FIG. 5F shows the structure of FIG. 5E being subjected to a non-amorphizing final ion implant 1160 which may be the same as or different from first ion implant 1120. Typically ion implant 1160 would be the same as or very similar to ion implant 1120, with the sum of the doses of implants 1120 and 1160 equal to the total desired implant dose. Ion implant 1160 again produces lightly damaged S/D regions 1130' including many small defects indicated by circles 1140'. The structure of FIG. 5F is then annealed to produce repaired S/D regions 1150 which still has all or most of their initial strain, as shown in FIG. 5G. Activation annealing may be included in the recrystallization anneal, or performed separately. Patterned masking layer 1110 is removed before or after these last annealing steps to produce the structure of FIG. 5H.

Another aspect of the invention provides at least one FET device in a semiconductor layer, the FET device comprising source/drain regions subjected to ion implantation while the semiconductor-on-insulator is held at an elevated temperature in the range from 70° C. to 900° C. While the temperature is held at an elevated temperature the temperature takes into account the temperature rise of the semiconductor-on-insulator due to self heating during ion implantation, which typically is in the range from 0° C. to 50° C. Typically, temperature increases encountered without deliberate wafer cooling are less than 25° C., but may be as high as 50° C. for high does, high current implants.

This invention also provides an FET device in a semiconductor layer, the FET device comprising source/drain regions is subjected to a divided-dose-anneal-in-between (DDAB) method of ion implantation comprising the steps of selecting a substrate including a semiconductor layer;

defining first semiconductor layer regions that will be subjected to at least two subsequent ion implantation steps and second semiconductor layer regions that will be protected from said at least two subsequent ion implantation steps;

protecting the second semiconductor layer regions from exposure to ion implantation;

subjecting the first semiconductor layer regions (but not the second semiconductor layer regions) to a first ion implantation;

subjecting the substrate to a first anneal;

subjecting the first semiconductor layer regions (but not the second semiconductor layer regions) to a final ion implantation; and subjecting the substrate to a final anneal;

wherein residual damage left in the first semiconductor layer regions (as measured by strain loss and/or defect density) after the final anneal is less than the residual damage that would be left in the first semiconductor layer regions if the above process steps were performed without the first anneal.

This invention also provides FET devices subjected to DDAB methods of ion implantation with multiple implant and annealing cycles, such as, for example, multiple implant and annealing cycles comprising the above first and final implants and anneals plus one or more cycles of supplemental implant and annealing steps comprising subjecting the first semiconductor layer regions (but not the second semiconductor layer regions) to a supplemental ion implantation; and subjecting the substrate to a supplemental anneal;

the cycles performed after the first anneal and before the final implant, wherein residual damage left in the first semiconductor layer regions (as measured by strain loss and/or defect density) after the final anneal is less than the residual damage that would be left in the first semiconductor layer regions if the above process steps were performed without the first and the supplemental annealing steps.

The FETs of this invention may be combined with other FETs to form complementary metal-oxide-semiconductor (CMOS) or other circuits.

The semiconductor layers described in this invention may comprise bulk semiconductors; semiconductor-on-insulator layers; or a combination of bulk and semiconductor-on-insulator layers such that at least part of the semiconductor layer is bulk and at least part of the semiconductor layer is disposed on an insulator; the semiconductor layers comprising one or more of Si, SiC, Ge, GeC, SiGe and SiGeC; these materials in layered combinations; these materials strained, partially strained (or partially relaxed) and/or unstrained (or fully relaxed).

The semiconductor layer may comprise, for example, a silicon-on-insulator layer with a thickness less than 30 nm. and/or FETs comprising semiconductor S/D regions separated by a semiconducting channel region, wherein said S/D regions and said channel regions comprise different semiconductor materials, and wherein said S/D regions are strained, partially strained, or unstrained. Particularly favored examples of the FETs to which the hot implant and DDAB methods of this invention may be applied include (i) FETs comprising a semiconducting channel region of Si and S/D regions of a strained SiGe alloy having a Ge content equal to or greater than 25 atomic percent, and (ii) FETs comprising a semiconducting channel region of Si and S/D regions of a strained SiC alloy having a C content greater than 0.5 atomic percent. The semiconductor layers may comprise of a single crystal orientation such as (100) or two or more single crystal orientations (as typified by hybrid orientation substrate technology) such as regions of (100) and (110).

The elevated temperatures for the heated implants of this invention would typically be in the range from 70 to 900° C., preferably be in the range from 150 to 550° C., and most preferably be in the range from 200-350° C. Annealing for the DDAB method would typically include any annealing process known to the art, including furnace annealing, rapid thermal annealing, and laser annealing, for time and temperature ranges known to the art, e.g., temperatures in the range from 150 to 1350° C. and times in the range from 24 hours to sub-milliseconds. Gas ambients may be selected from those known to the art, typically $N_2$ or Ar with or without additional additives selected from the group $NH_3$, $H_2O$, $H_2$, $O_2$, NO, $N_2O$, etc.

The ion implantation of this invention may be performed with any ion known to the art, including atomic ions, molecular ions, singly-charged ions, and multiply-charged ions. Particularly favored ions include the ions of As, B, Bi, $BF_2$, Ge, P and Sb. The conditions for the individual implants comprising the DDAB method may be the same or different in one or more particulars (for example, first and final implants might utilize the same species and energy but be different in angle of incidence).

Three examples of the invention will now be described. In the first, it is shown that in situ heating during ion implantation can prevent the amorphization of SOI layers that would occur if the same implants were performed at room temperature such as in the range from 20° C. to 25° C. In the second example, we show how the dependence of amorphization depth on As implant dose may be used to calculate an optimum implementation of the DDAB technique in a semiconductor-on-insulator layer. In the third example, we show how the hot implant and DDAB techniques may be used to preserve the strain in pseudomorphic SiGe layers grown on Si.

Example 1

Figure 6:
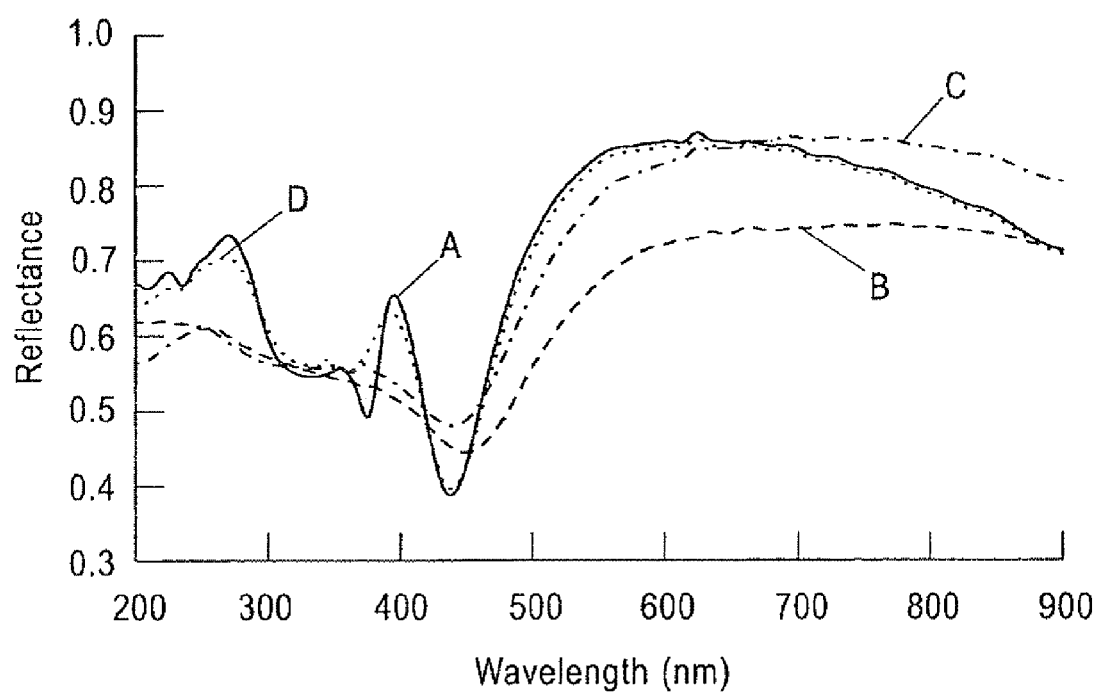
FIG. 6 compares reflectance vs. wavelength data for SOI layers implanted with $As^+$ at three different temperatures to data for a control sample that did not receive an implant.

The example shows that in situ heating during ion implantation can prevent the amorphization of SOI layers that would occur if the same implants were performed at room temperature. SOI layers 28 nm in thickness were implanted at 26, 150, or 300° C. with $3 \times 10^{15}/cm^2$ 50 keV $As^+$, an implant that has an average projected range (Rp) of about 340 Å and would ordinarily completely amorphize the SOI layer. The reflectance vs. wavelength data of FIG. 6 indicates that the SOI layer has indeed been amorphized in the 26 and 150° C. samples (curves B and C, respectively), but remains crystalline (with a reflectance curve nearly identical to curve A of the unimplanted control sample) for the 300° C. implant (curve D). The sheet resistance (Rs) measurements of Table I corroborate these results: after annealing in $N_2$ at 900° C. for 1 min, the 26 and 150° C. samples have Rs in the range of 8-11 kohm/square, consistent with a recrystallization of the amorphous SOI layer to polycrystalline Si; in contrast, the 300° C. sample has a Rs of 790 ohm/sq, consistent with doped single-crystal Si. In addition, the implanted $As^+$ is quite substantially activated even as-implanted (Rs ~15.5 kohm/sq) and is more activated (with an Rs of 4.4 kohm/sq) after very mild annealing (500° C./1 min) than the 26 and 150° C. samples are after 900° C./1 min.

Table I shows Rs measurements (ohm/sq) of samples implanted with $3\times10^{15}/cm^2$ 50 keV $As^+$.

TABLE I

| Anneal/Implant Temperature | 26° C. | 150° C. | 300° C. |
|---|---|---|---|
| as-implanted | >1000k | >1000k | 15.5k |
| 500° C./1 min | >1000k | >1000k | 4.4k |
| 900° C./1 min | 10.7k | 8.2k | 790 |

Example 2

In the second example, we show how one may use the dependence of amorphization depth on implant dose to calculate an optimum implementation of the DDAB technique in a semiconductor-on-insulator layer disposed on a buried oxide (box). SOI layers 160 nm in thickness were implanted at room temperature with 100 keV $As^+$ (Rp about 71 nm) at doses of 1.25, 2.5, and $5.0\times10^{15}/cm^2$ to produce surface amorphous layers having thicknesses of 91, 111, and 117 nm respectively. None of these doses were sufficient to amorphize the entire 160 nm thickness of the SOI layer. However, SOI layers thinner than about 110 nm in thickness would be expected to totally amorphize at doses higher than $2.5\times10^{15}/cm^2$, form polycrystalline Si upon activation annealing. Dividing the $2.5\times10^{15}/cm^2$ dose into two doses of $1.25\times10^{15}/cm^2$ would leave a residual crystalline layer between the 91 nm amorphization depth and the top of the box after each implant. Annealing between the implants allows the crystallinity of the sample to be restored (by SPE templating from the residual crystalline layer) before the next implant and results in a crystalline material after a final activation anneal.

Example 3

Figure 7:
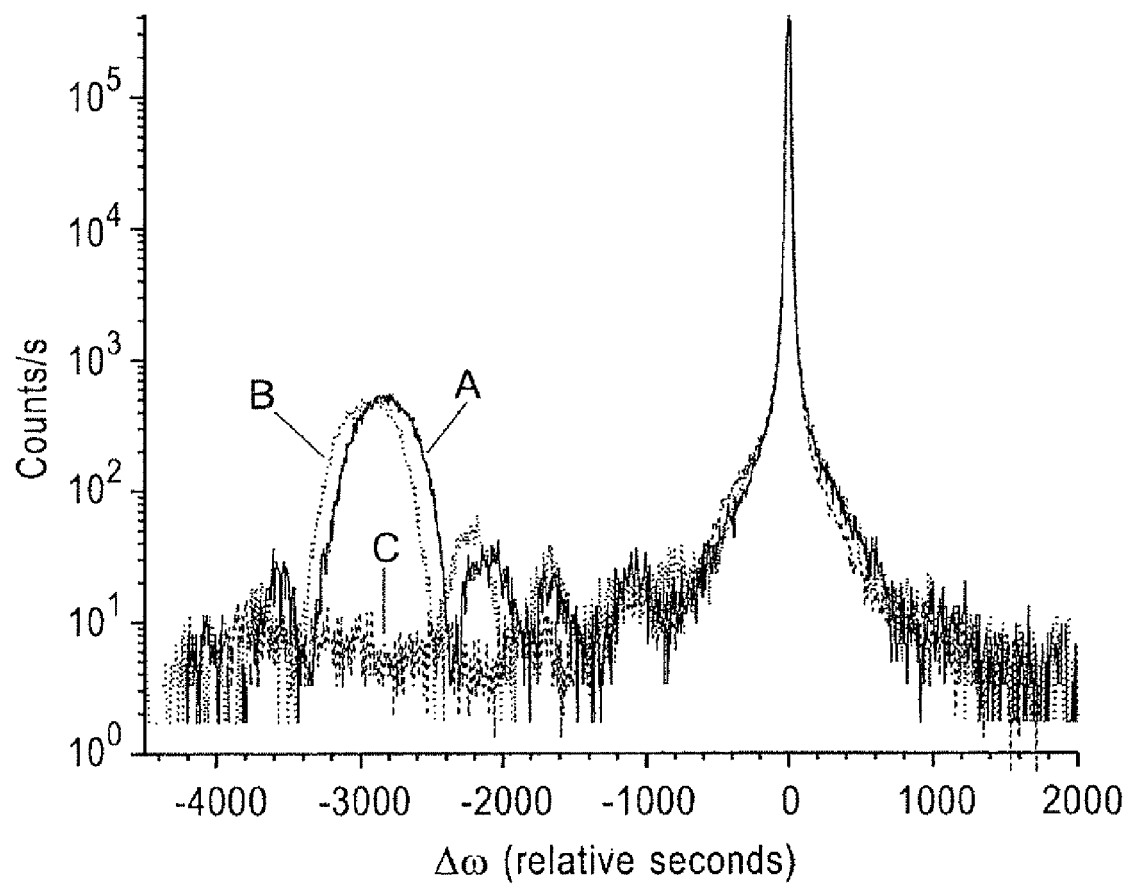
FIG. 7 illustrates the utility of hot implants with a comparison of high resolution x-ray diffraction (HRXRD) rocking curve (RC) data for an as-grown SiGe sample (curve A) to SiGe samples implanted with $As^+$ at 300° C. (curve B) or room temperature (curve C)
Figure 8:
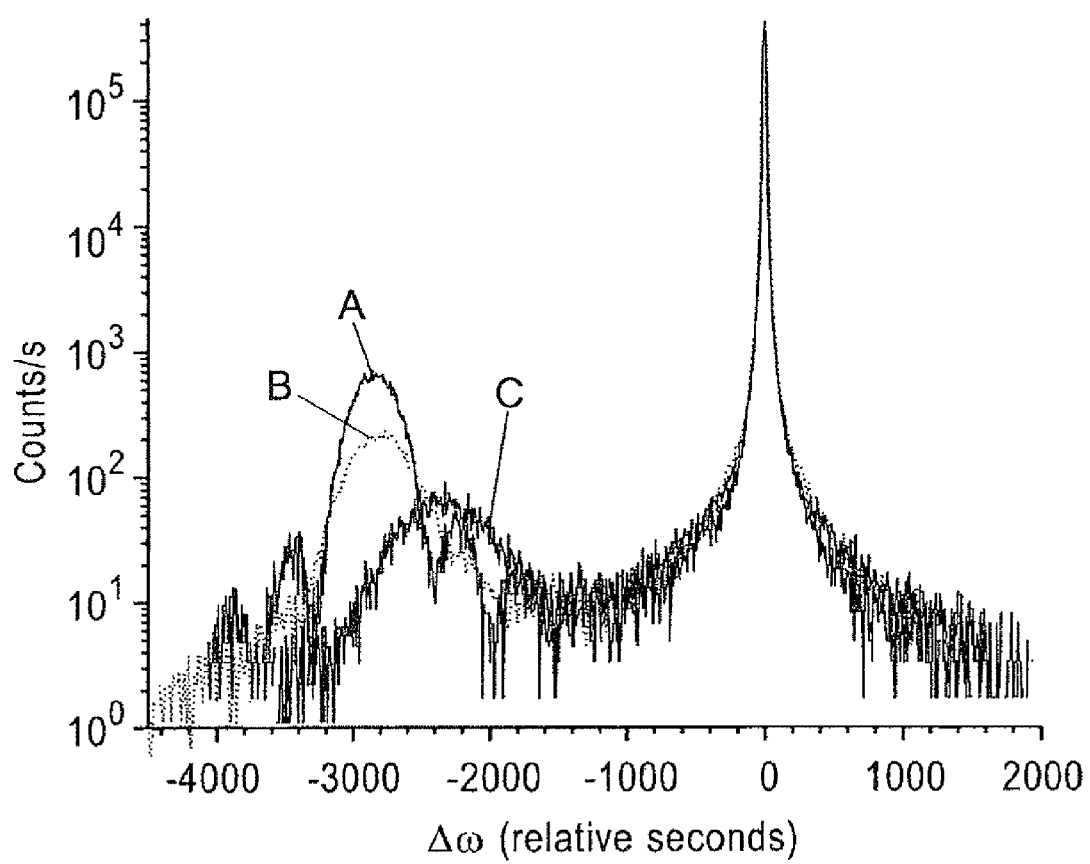
FIG. 8 shows HRXRD RC data for the samples of FIG. 7 after an anneal at 1080° C. for 1 s (using a 150° C./s heating ramp rate)
Figure 9:
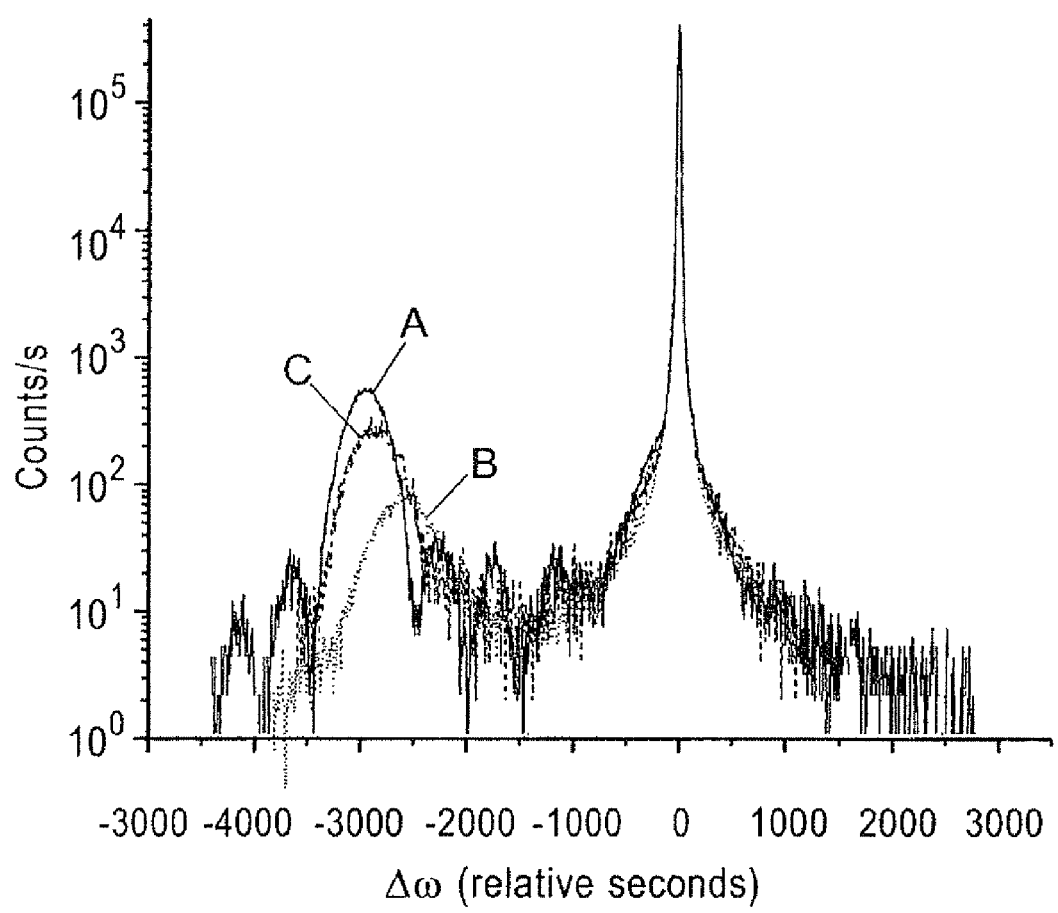
FIG. 9 illustrates the strain-preserving features of the DDAB technique with a comparison of HRXRD RC data for the as-grown SiGe sample of FIG. 7A (curve A) to identical SiGe samples given a single $As^+$ implant and anneal (curve B) or a two-step DDAB implant and anneal (curve C).

In the third example, we show how the hot implant and DDAB techniques may be used to preserve the strain in pseudomorphic SiGe layers grown on Si. FIGS. 7-9 show high resolution x-ray diffraction (HRXRD) (004) rocking curves (RCs) of a structure comprised by 40-nm-thick $Si_{0.70}Ge_{0.30}$ layers epitaxially grown on (100) Si substrate, taken before and after implantation with $As^+$ to a dose below the amorphization threshold dose. In FIGS. 7-9, the ordinate represents the intensity of diffracted x-ray in counts/second and the abscissa represents delta rocking angle omega in unity of seconds of degree, having the scale origin set at the Si substrate diffraction peak. The SiGe peak (at negative angles in FIGS. 7-9) typically comprises a main peak bordered by weaker satellite peaks (thickness fringes or Pendellosung oscillations) whose spacing allows a precise estimate of the SiGe thickness. The intensities of the main peak and the satellite peaks are highest when the SiGe is perfectly ordered and defect-free, and decrease with increasing film disorder. The angular separation of the SiGe diffraction peak from that of Si substrate correlates with the magnitude of the compressive strain in the epi-layer.

FIG. 7 demonstrates the utility of hot implants by comparing the RCs of an as-grown sample (curve A) to samples implanted with $2\times10^{13}/cm^2$, 50 keV $As^+$ at 0° tilt at 300° C. (curve B) or room temperature (curve C). The as-grown sample has a strain of 1.17% and very distinct thickness fringes; the hot implanted sample has nearly identical thickness fringes (indicating negligible implant damage) and very slightly increased strain (1.20%). In contrast, the sample implanted at room temperature shows no main peak and thickness fringes in the noise, a clear indication of severe damage.

FIG. 8 shows the RCs of samples of FIG. 7 after an anneal at 1080° C. for 1 s (using a 150° C./s heating ramp rate). RC (curve A) for the unimplanted sample shows a strain of 1.14%, indicating that the initial strain is not significantly decreased by annealing alone. RC (curve B) for the hot implanted sample shows a strain of 1.09%, again very close to the pre-implant, pre-anneal value. RC (curve C) for the sample implanted at room temperature shows a restoration of the SiGe peak (indicative of substantial damage repair), but much reduced strain (0.65%). FIGS. 7 and 8 thus demonstrate that implant temperature is the key factor in determining whether a given implant energy/dose and subsequent activation anneal will preserve the initial strain or very substantially reduce it.

FIG. 9 illustrates the strain-preserving features of the DDAB technique. RC (curve A) shows the as-grown sample of FIG. 7A, which had an initial strain of 1.17%. RC (curve B) shows a sample subjected to a single-step-implant/anneal sequence comprising a room temperature implant of $2\times10^{13}/cm^2$, 50 keV $As^+$ followed by an anneal at 650° C. for 10 min, resulting in a final strain of 0.88% (a significant loss). RC (curve C) shows the contrasting results of the DDAB technique using a double-step-implant/anneal sequence in which the $2\times10^{13}/cm^2$ $As^+$ dose is evenly divided into two doses of $1\times10^{13}/cm^2$, with each implant followed by an anneal at 650° C. for 10 min. The strain in this case is 1.12%, very close to the original value of 1.17%, very clearly indicating the benefits of the DDAB technique.

It should be noted that the DDAB technique of course involves a tradeoff between the process time for the additional implant and annealing steps and the benefits of further subdivision in implant dose (as measured by a decrease in strain loss). In many cases, the double-step-implant/anneal sequence may be selected optimal. However, the optimal number of subdivisions is likely to be higher for the case of SiGe with a high Ge content and/or materials requiring high implant doses.

While several embodiments of the invention, together with modifications thereof, have been described in detail herein and illustrated in the accompanying drawings, it will be evident that various further modifications are possible without departing from the scope of the invention. For example, (i) multiple hot implants differing in dose, species, and/or energy might be performed with the same masking layer, and/or (ii) the individual implants comprising the DDAB method might include some in situ heating during implantation. Nothing in the above specification is intended to limit the invention more narrowly than the appended claims. The examples given are intended only to be illustrative rather than exclusive.

Having thus described our invention, what we claim as new and desire to secure by Letters Patent is:

1. A divided-dose-anneal-in-between (DDAB) method of ion implantation comprising:
   forming a disposable masking layer on a substrate including a semiconductor layer, wherein said disposable masking layer defines first semiconductor layer regions that are not covered by said disposable masking layer and second semiconductor layer regions that are covered by said disposable masking layer;
   subjecting said first semiconductor layer regions to a plurality of ion implantations including a first ion implantation and a final ion implantation, wherein all of said first semiconductor regions are implanted in each of said plurality of ion implantations and all of said second semiconductor regions are protected from ions during each of said plurality of ion implantations by said disposable masking layer or by another disposable masking layer;
   subjecting said substrate to an anneal between each adjacent ion implantations within said plurality of ion implantations and after said final ion implantation, wherein a first anneal is performed after said first ion implantation and a final anneal is performed after said final ion implantation; and removing all of said disposable masking layer and any other disposable masking layer employed during said plurality of ion implantations, wherein residual damage left in said first semiconductor layer regions, as measured by strain loss and/or defect density, after the final anneal is less than the residual damage that would be left in said first semiconductor layer regions if the above process steps were performed without said first anneal.

2. The method of claim 1 further including one or more cycles of supplemental implant and annealing steps comprising:

subjecting said first semiconductor layer regions, but not said second semiconductor layer regions, to a supplemental ion implantation; and subjecting said substrate to a supplemental anneal;

said cycles performed after the first anneal and before the final implant, wherein residual damage left in said first semiconductor layer regions, as measured by strain loss and/or defect density, after the final anneal is less than the residual damage that would be left in said first semiconductor layer regions if the above process steps were performed without said first and said supplemental annealing steps.

3. The method of claim 1 wherein a disposable masking layer defining said first and second semiconductor layer regions is applied to the substrate before each implant step and removed from the substrate before each annealing step.

4. The method of claim 1 wherein said disposable masking layer defining said first and second semiconductor layer regions is applied to the substrate before the first implant step and not removed from the substrate until after the final implant step.

5. The method of claim 1 wherein said semiconductor layer comprises a bulk semiconductor; a semiconductor-on-insulator layer; or a combination of bulk and semiconductor-on-insulator layers such that at least part of the semiconductor layer is bulk and at least part of the semiconductor layer is disposed on an insulator; said semiconductor layer comprising one or more of Si, SiC, Ge, GeC, SiGe, and SiGeC; these materials in layered combinations; these materials strained, partially strained, or unstrained.

6. The method of claim 1 wherein said semiconductor layer comprises a silicon-on-insulator layer with a thickness less than 30 nm.

7. The method of claim 1 wherein said FET comprises semiconductor S/D regions separated by a semiconducting channel region, said S/D regions and said channel regions comprising different semiconductor materials, said S/D regions being strained, partially strained, or unstrained.

8. The method of claim 1 performed at a temperature over 150° C. and under 1350° C.

9. The ion implantation of claim 1 wherein the ion implanted species comprises one or more of As, B, Bi, BF2, Ge, P, and Sb.

10. The method of claim 1 wherein said disposable masking layer comprises a material selected from photoresist materials and amorphous carbon with a hydrogen content less than 15 atomic %.

11. The method of claim 1 wherein said disposable masking layer comprises amorphous carbon with a hydrogen content less than 15 atomic %.

12. The method of claim 3 wherein each of said disposable masking layers that are applied to said substrate before each implant step and removed from said substrate before each annealing step comprises a material selected from photoresist materials and amorphous carbon with a hydrogen content less than 15 atomic %.

13. The method of claim 3 wherein each of said disposable masking layers that are applied to said substrate before each implant step and removed from said substrate before each annealing step comprises amorphous carbon with a hydrogen content less than 15 atomic %.

14. The method of claim 4 wherein said disposable masking layer comprises a material selected from photoresist materials and amorphous carbon with a hydrogen content less than 15 atomic %.

15. The method of claim 4 wherein said disposable masking layer comprises amorphous carbon with a hydrogen content less than 15 atomic %.

16. The method of claim 7 wherein said semiconducting channel region comprises Si and said S/D regions comprise a strained SiGe alloy having a Ge content equal to or greater than 25 atomic percent.

17. The method of claim 7 wherein said semiconducting channel region comprises Si and said S/D regions comprise a strained SiC alloy having a C content equal to or greater than 0.5 atomic percent.

18. A divided-dose-anneal-in-between (DDAB) method of ion implantation comprising:

forming a disposable masking layer on a substrate including a semiconductor layer, wherein said disposable masking layer defines first semiconductor layer regions that are not covered by said disposable masking layer and second semiconductor layer regions that are covered by said disposable masking layer;

subjecting said first semiconductor layer regions to a plurality of ion implantations including a first ion implantation and a final ion implantation, wherein all of said first semiconductor regions are implanted in each of said plurality of ion implantations and all of said second semiconductor regions are protected from ions during each of said plurality of ion implantations by said disposable masking layer;

subjecting said substrate to an anneal between each adjacent ion implantations within said plurality of ion implantations and after said final ion implantation, wherein a first anneal is performed after said first ion implantation and a final anneal is performed after said final ion implantation; and removing all of said disposable masking layer after said final ion implantation.

19. The method of claim 18 further including one or more cycles of supplemental implant and annealing steps comprising:

subjecting said first semiconductor layer regions, but not said second semiconductor layer regions, to a supplemental ion implantation; and subjecting said substrate to a supplemental anneal;

said cycles performed after the first anneal and before the final implant.

20. The method of claim 18 wherein said disposable masking layer comprises a material selected from photoresist materials and amorphous carbon with a hydrogen content less than 15 atomic %.

21. The method of claim 18 wherein said disposable masking layer comprises amorphous carbon with a hydrogen content less than 15 atomic %.

* * * * *